(12) United States Patent
Park et al.

(10) Patent No.: US 10,797,116 B2
(45) Date of Patent: Oct. 6, 2020

(54) COMPLEX FILM AND ORGANIC LIGHT EMITTING DISPLAY DEVICE COMPRISING THE SAME

(71) Applicant: LG Display Co., Ltd., Seoul (KR)

(72) Inventors: Seongwoo Park, Osan-si (KR); Moonsun Lee, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 37 days.

(21) Appl. No.: 16/113,217

(22) Filed: Aug. 27, 2018

(65) Prior Publication Data
US 2019/0131351 A1   May 2, 2019

(30) Foreign Application Priority Data
Oct. 31, 2017   (KR) .................. 10-2017-0143906

(51) Int. Cl.
| | |
|---|---|
| *H01L 27/32* | (2006.01) |
| *H01L 51/00* | (2006.01) |
| *H01L 51/52* | (2006.01) |
| *B32B 7/12* | (2006.01) |
| *B82Y 20/00* | (2011.01) |

(52) U.S. Cl.
CPC .............. *H01L 27/322* (2013.01); *B32B 7/12* (2013.01); *H01L 27/3244* (2013.01); *H01L 51/0097* (2013.01); *H01L 51/5253* (2013.01); *H01L 51/5281* (2013.01); *B32B 2307/402* (2013.01); *B32B 2307/42* (2013.01); *B82Y 20/00* (2013.01); *H01L 2251/5338* (2013.01); *H01L 2251/5369* (2013.01)

(58) Field of Classification Search
CPC ......... H01L 51/0097; H01L 2251/5338; H01L 27/322; H01L 51/5253; H01L 51/5256; H01L 51/502; G02B 6/3817; G02B 6/3818; G02B 6/0055; B32B 2307/42
See application file for complete search history.

(56) References Cited

U.S. PATENT DOCUMENTS

| | | | | |
|---|---|---|---|---|
| 2017/0261180 | A1* | 9/2017 | Nakamura | ........ G02F 1/133615 |
| 2018/0033843 | A1* | 2/2018 | Liu | ................... G02F 1/133305 |

FOREIGN PATENT DOCUMENTS

| | | |
|---|---|---|
| EP | 2 993 515 A1 | 3/2016 |
| KR | 10-2014-0042274 A | 4/2014 |
| KR | 10-2016-0082760 A | 7/2016 |
| WO | 2007/051499 A1 | 5/2007 |

\* cited by examiner

*Primary Examiner* — Thanhha S Pham
(74) *Attorney, Agent, or Firm* — Polsinelli PC

(57) ABSTRACT

An organic light emitting display device and a complex film included in the organic light emitting display device are disclosed, which facilitates bending on a bending area and has optical characteristics of wide color gamut, whereby a stereoscopic effect may be improved. The organic light emitting display device comprising a substrate; and a complex film provided on the substrate, wherein the complex film includes an adhesive layer having a first area and a second area; an optical film provided on the first area of the adhesive layer; an optical conversion film provided on the second area of the adhesive layer; and a protective film covering the optical film and the optical conversion film.

18 Claims, 6 Drawing Sheets

COMPLEX FILM AND ORGANIC LIGHT EMITTING DISPLAY DEVICE COMPRISING THE SAME

CROSS REFERENCE TO RELATED APPLICATION

This application claims the benefit of the Korean Patent Application No. 10-2017-0143906 filed on Oct. 31, 2017, which is hereby incorporated by reference in its entirety as if fully set forth herein.

BACKGROUND

Field of the Disclosure

The present disclosure relates to a complex film and an organic light emitting display device comprising the same.

Description of the Background

With the advancement of the information age, a demand for a display device for displaying an image has been increased in various forms. Among display devices, an organic light emitting display device is a self-light emitting device, and has received attention as a next generation display device owing to its advantages in that a viewing angle is wide, a contrast ratio are excellent and a response speed is fast. Recently, an organic light emitting display device of a slimmer size has been launched. Particularly, a flexible organic light emitting display device has many advantages in that it is easy to carry and may be applied to various shaped devices. Since the flexible organic light emitting display device includes a bending area that can fold a substrate and may reduce a bezel size by folding the substrate at the bending area, an organic light emitting display device having a narrow bezel may be realized.

However, since an optical film formed on the bending area is thick and vulnerable to stress, outermost stress is increased and a stress inside a panel becomes strong if a bending level of the organic light emitting display device is increased. Therefore, problems can occur in that a light emitting diode layer is peeled off and/or a thin film transistor is broken. To solve these problems, if the optical film formed on the bending area is removed, a problem occurs in that a color gamut of the bending area is deteriorated and thus a stereoscopic video quality and an immersion level may be deteriorated.

SUMMARY

The present disclosure has been made in view of the above problems, and to provide an organic light emitting display device that enhances the color gamut at a bending area while facilitating bending.

In addition, the present disclosure to provide a complex film that enhances the color gamut at a bending area while facilitating bending of an organic light emitting display device.

In accordance with an aspect of the present disclosure, the above and other objects can be accomplished by the provision of a complex film comprising an adhesive layer having a first area and a second area; an optical film provided on the first area of the adhesive layer; an optical conversion film provided on the second area of the adhesive layer; and a protective film covering the optical film and the optical conversion film.

In accordance with another aspect of the present disclosure, there is provided an organic light emitting display device comprising a substrate; and a complex film provided on the substrate, wherein the complex film includes an adhesive layer having a first area and a second area; an optical film provided on the first area of the adhesive layer; an optical conversion film provided on the second area of the adhesive layer; and a protective film covering the optical film and the optical conversion film.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION DISCLOSURE

Figure 1:
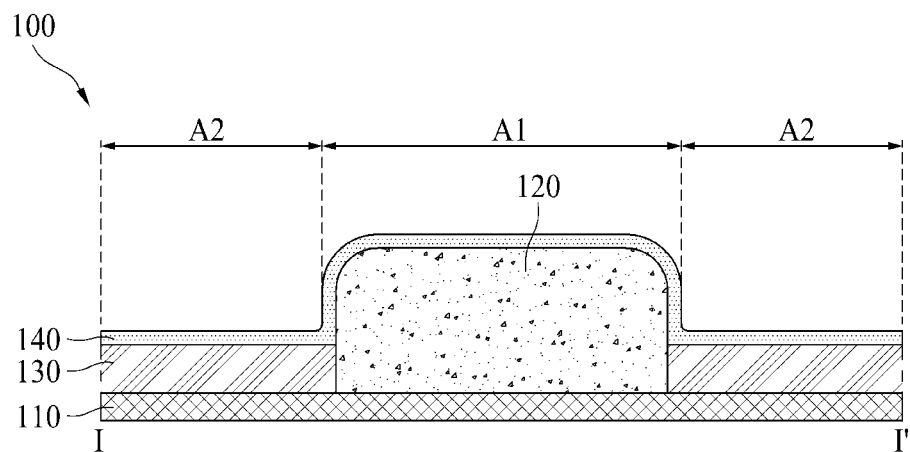
FIG. 1 is a cross-sectional view illustrating a complex film according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

"A first horizontal-axis direction", "a second horizontal-axis direction" and "a vertical-axis direction" should not be construed by a geometric relation only of a mutual vertical relation, and may have broader directionality within the range that elements of the present disclosure may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, the aspects of the present disclosure of a complex film and an organic light emitting display device according to the present disclosure will be described in detail with reference to the accompanying drawings. Wherever possible, the same reference numbers will be used throughout the drawings to refer to the same or like parts.

Figure 2:
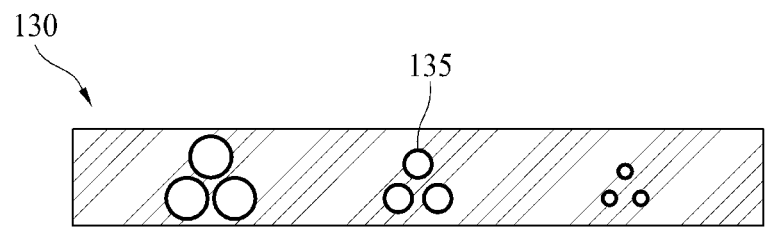
FIG. 2 is an enlarged view illustrating an optical conversion film shown in FIG. 1.
Figure 3:
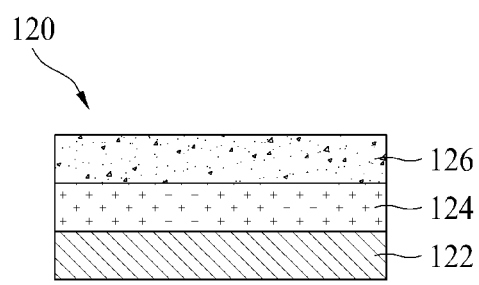
FIG. 3 is an enlarged view illustrating an optical film shown in FIG. 1.

FIG. 1 is a cross-sectional view illustrating a complex film according to an aspect of the present disclosure. FIG. 2 is an enlarged view illustrating an optical conversion film shown in FIG. 1. FIG. 3 is an enlarged view illustrating an optical film shown in FIG. 1.

Referring to FIGS. 1 to 3, the complex film 100 comprises an adhesive layer 110, an optical film 120, an optical conversion film 130, and a protective film 140.

The adhesive layer 110 includes a first area A1 and a second area A2. The first area A1 and the second area A2 may be corresponding to a non-bending area and a bending area of a substrate, respectively. This detailed structure will be described later. The adhesive layer 110 may be a thermal hardening adhesive or a natural hardening adhesive. For example, the adhesive layer 110 may be made of a material such as a pressure-sensitive adhesive material or a barrier pressure-sensitive adhesive material having a moisture absorption function.

The optical film 120 is provided on the first area A1 of the adhesive layer 110. The optical film 120 includes a low reflection film such as anti-reflection film and anti-glare film, or a polarizing film. A plurality of layers of these films may form the optical film 120. The optical film 120 may prevent the water (or moisture) permeation, improve the visibility through anti-reflection of external light, and enhance the color gamut of light emitted from a light emitting diode layer.

The optical film 120 includes a wave plate 122 (such as a half-wave plate or a quarter wave plate), a linear polarizing plate 124, and a low-reflection layer 126.

The wave plate 122 is provided on the first area A1 of the adhesive layer 110. The wave plate 122 may be made of Reactive Mesogen. The wave plate 122 may have a transmissive axis of 45° or −45°. The wave plate 122 polarizes linear polarized light of 90° to circular polarized light and polarizes the circular polarized light to linear polarized light of 0°.

The linear polarizing plate 124 is provided on the wave plate 122. The linear polarizing plate 124 may be made of a mixture of Mesogen and a dichroic pigment, a mixture of Lyotropic liquid crystal and a dichroic pigment, and a mixture of PVA corresponding to a polymer material, which is adsorbed and oriented with a pigment. This linear polarizing plate 124 may be configured to have a transmissive axis of 90°. Therefore, the linear polarizing plate 124 linearly polarizes light at 90° direction.

The low-reflection layer 126 is provided on the linear polarizing plate 124. The low-reflection layer 126 may be subjected to surface treatment such as hard coating or low-reflection treatment to reduce the reflectivity under a high illumination environment. Since the low-reflection layer 126 may be made of a hydrophobic transparent resin film or glass, the low-reflection layer 126 may protect the linear polarizing plate 124 from moisture or an external force.

The optical film 120 may improve visibility by preventing the external light from being reflected. The incident light externally entering into the optical film 120 is linearly polarized at 90° while passing through the liner polarizing plate 124 and then circularly polarized while passing through the wave plate 122. The circularly polarized light is reflected by the several lines and the electrodes in a display area by passing through a substrate to which the complex film 100 is attached, and is again linearly polarized at 0° direction while passing through the wave plate 122. Since the linear polarized light of 0° direction is perpendicular to the transmissive axis of the linear polarizing plate 124, the linear polarized light of 0° direction fails to pass through the linear polarizing plate 124, whereby reflection of external light is prevented.

The optical conversion film 130 is provided on the second area A2 of the adhesive layer 110. The optical conversion film 130 may be formed of a film type or a sheet type. A transparent film may be used as this optical conversion film 130 without any specific conditions, but a film having excellent transparency, mechanical intensity and thermal stability may be used.

The optical conversion film 130 includes a plurality of optical conversion particles 135.

The optical conversion particles 135 may be injected into the optical conversion film 130. The optical conversion particles 135 absorb lights having the short wavelength and then emit light. Furthermore, the optical conversion particles 135 may selectively emit the light having a specific wavelength to improve color gamut. Since the optical conversion particles 135 may absorb light, the optical conversion particles 135 may serve as the external light anti-reflection function instead of the optical film 120.

The optical conversion particles 135 may be the quantum-dots.

The quantum-dot is a nano-sized semiconductor material. Atoms constitute molecules, and the molecules constitute a set of small molecules called a cluster to form nano-particle. When the nano-particle has semiconductor characteristics, it may be referred to as a quantum-dot. When the quantum-dot reaches to an excited state by receiving the energy from the outside, the quantum-dot emits light according to the energy band gap.

The quantum-dot according to one example is not specially limited as it is a quantum-dot that may emit light in accordance with stimulus cause by light. For example, the quantum-dot may be selected from a group made of a II-IV group semiconductor compound, III-V group semiconductor compound, IV-VI group semiconductor compound, IV group element or a compound containing IV group element, and a combination thereof. These compounds may be used independently or by mixture of two or more.

The II-IV group semiconductor compound may include one of a two-element compound group of CdS, CdSe, CdTe, ZnS, ZnSe, ZnTe, ZnO, HgS, HgSe, HgTe, and a mixture thereof, one of a three-element compound group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe and a mixture thereof, and one of a four-element compound group of CdZnSeS, CdZnSeTe, CdZnSTe, CdHgSeS, CdHgSeTe, CdHgSTe, HgZnSeS, HgZnSeTe, HgZnSTe, and a mixture thereof. The III-V group semiconductor compound may include one of a two-element compound group of GaP, GaAs, GaSb, AlN, AlP, AlAs, AlSb, InN, InP, InAs, InSb, and a mixture thereof, one of a three-element compound group of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and one of a four-element compound group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The IV-VI group semiconductor compound may include one of a two-element compound group of SnS, SnSe, SnTe, PbS, PbSe, PbTe, and a mixture thereof, one of a three-element compound group of SnSeS, SnSeTe, SnSTe, PbSeS, PbSeTe, PbSTe, SnPbS, SnPbSe, SnPbTe, and a mixture thereof, and one of a four-element compound group of SnPbSSe, SnPbSeTe, SnPbSTe, and a mixture thereof. The IV group element or the compound containing the IV group element may include a group made of an elementary substance group of Si, Ge, and a mixture thereof and one of a two-element compound group of SiC, SiGe, and a mixture thereof.

The optical conversion particles 135 according to one example may be a red quantum-dot, a green quantum-dot and a blue quantum-dot, which have different sizes each other. In the same manner as that a colored photoresistive composition used for manufacture of a conventional color filter includes red, green and blue pigments for color gamut, the optical conversion particles 135 according to the present disclosure may be categorized into a quantum-dot indicating red, a quantum-dot indicating green and a quantum-dot indicating blue.

The protective film 140 is provided on the optical film 120 and the optical conversion film 130. The protective film 140 may protect the optical conversion film 130 which is very thin, and may be a transparent film. A film having excellent properties such as the mechanical intensity, the thermal stability, the waterproof and the isotropy property may be used as the protective film 140. For example, acetate based resin film such as triacetylcelluose (TAC), polyester based resin film, polyethersulfone based resin film, polycarbonate based resin film, polyamide based resin film, polyimide base resin film, polyolefin based resin film, cycloolefin based resin film, polyurethane based resin film and acrylic resin film may be used as the protective film. However, the protective film is not limited to these examples.

The protective film 140 according to one example is provided to protect the optical film 120 and the optical conversion film 130 from external particles, and its thickness may be selected a range from 1 μm to 500 μm, or 1 μm to 300 μm. A functional coating layer may be further provided on at least one surface of the protective film 140.

The functional coating layer may be, but not limited to, an external reflection attenuation layer or a luminance enhancement layer, and may be used as an optical function layer.

The complex film 100 according to the present disclosure respectively forms the optical film 120 and the optical conversion film 130 on the first area A1 and the second area A2 of the adhesive layer 110, and a sidewall of the optical film 120 is in contact with a sidewall of the optical conversion film 130. Since the optical film 120 may have a stacked structure for ensuring a polarizing function, the optical film 120 is formed to be much thicker than the optical conversion film 130. Therefore, the optical film 120 and the optical conversion film 130 form a very high step difference at a boundary portion.

Since the protective film 140 is provided to cover the optical film 120 and the optical conversion film 130, the protective film 140 may protect the boundary portion of the optical film 120 and the optical conversion film 130. Since the step difference occurs in the boundary portion due to a difference in thickness between the optical film 120 and the optical conversion film 130, the optical film 120 and the optical conversion film 130 may be damaged by the external impact and then separated from each other. However, since the protective film 140 is formed to cover the boundary portion of the optical film 120 and the optical conversion film 130, the optical film 120 and the optical conversion film 130 may be protected from the external impacts or forces and prevented from being separated from each other.

The complex film 100 according to the present disclosure may be attached to the substrate by the adhesive layer 110. The organic light emitting display device to which the complex film 100 is attached has color purity relatively higher than the organic light emitting display device without the complex film, and may output light with uniform luminance over the whole surfaces and facilitate edge bending. A detailed structure of the organic light emitting display device to which the complex film 100 is attached will be described later.

Figure 4:
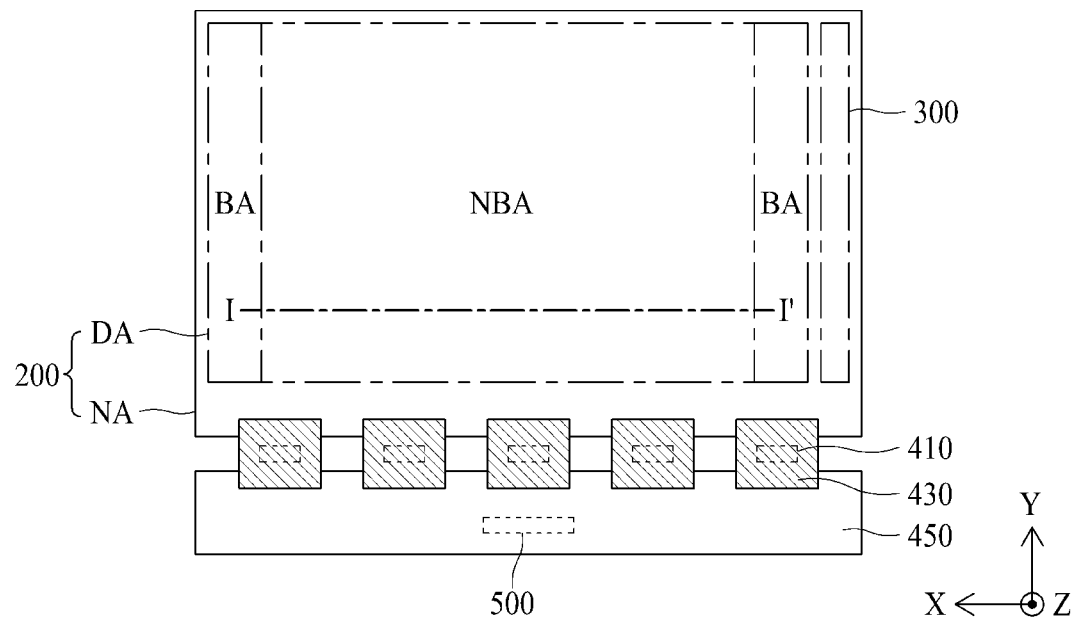
FIG. 4 is a plane view illustrating an organic light emitting display device according to one aspect of the present disclosure.

FIG. 4 is a plane view illustrating an organic light emitting display device according to an aspect of the present disclosure.

Referring to FIG. 4, the organic light emitting display device according to an aspect of the present disclosure comprises a substrate 200, a gate driver 300, a source drive integrated circuit 410, a flexible film 430, a circuit board 450, and a timing controller 500.

The substrate 200 includes a display area DA for displaying an image and a non-display area NA for not displaying an image. On the display area DA, gate lines, data lines and pixels may be formed. On the non-display area NA, the gate driver 300 and pads may be disposed.

The display area DA is a display area for displaying an image, and may be defined at a middle portion of the substrate 200. The display area DA according to one example may include a bending area BA provided at an edge portion of the display area DA and a non-bending area NBA provided at a portion except the bending area BA.

The bending area BA may be defined as an edge display area for displaying an image at a side of the organic light emitting display device. A width of the bending area BA according to one example may be set based on a radius of curvature for the bending structure.

The non-bending area NBA may be defined as a front display area for displaying an image at a front side of the organic light emitting display device.

The non-display area NA is provided at the other portion except the display area DA provided on the substrate 200, and may be defined as an edge portion of the substrate 200 surrounding the display area DA. The non-display area NA is in the periphery of the outside of the display area DA and does not display an image unlike the display area DA.

The gate driver 300 supplies gate signals to the gate lines in accordance with a gate control signal received from the timing controller 500. The gate driver 300 may be formed on the non-display area NA outside one side or both sides of the display area DA of the substrate 200 in a gate driver in panel (GIP) mode. Alternatively, the gate driver 300 may be fabricated of a driving chip, packaged in a flexible film 430 and attached to the non-display area NA outside one side or both sides of the display area DA of the substrate 200 in a tape automated bonding (TAB) mode.

The source drive integrated circuit 410 receives the digital video data and a source control signal from the timing controller 500. The source drive integrated circuit 410 converts the digital video data into the analog data voltages in accordance with the source control signal and supplies the analog data voltages to the data lines. When the source drive integrated circuit 410 is fabricated of a driving chip, the source drive integrated circuit 410 may be packaged in the flexible film 430 in a chip on film (COF) or chip on plastic (COP) mode.

Lines which connect pads to the source drive integrated circuit 410 and lines which connect the pads to lines of the circuit board 450 may be formed in the flexible film 430. The flexible film 430 may be attached onto the pads by an anisotropic conducting film, whereby the pads may be connected with the lines of the flexible film 430.

The circuit board 450 may be attached to the flexible films 430. A plurality of circuits comprised of driving chips may be packaged in the circuit board 450. For example, the timing controller 500 may be packaged in the circuit board 450. The circuit board 450 may be a printed circuit board or a flexible printed circuit board.

The timing controller 500 receives digital video data and a timing signal from an external system board through a cable of the circuit board 450. The timing controller 500 generates a gate control signal for controlling an operation timing of the gate driver 300 and a source control signal for controlling the source drive integrated circuits 410 on the basis of the timing signal. The timing controller 500 supplies the gate control signal to the gate driver 300, and supplies the source control signal to the source drive integrated circuits 410.

Figure 5:
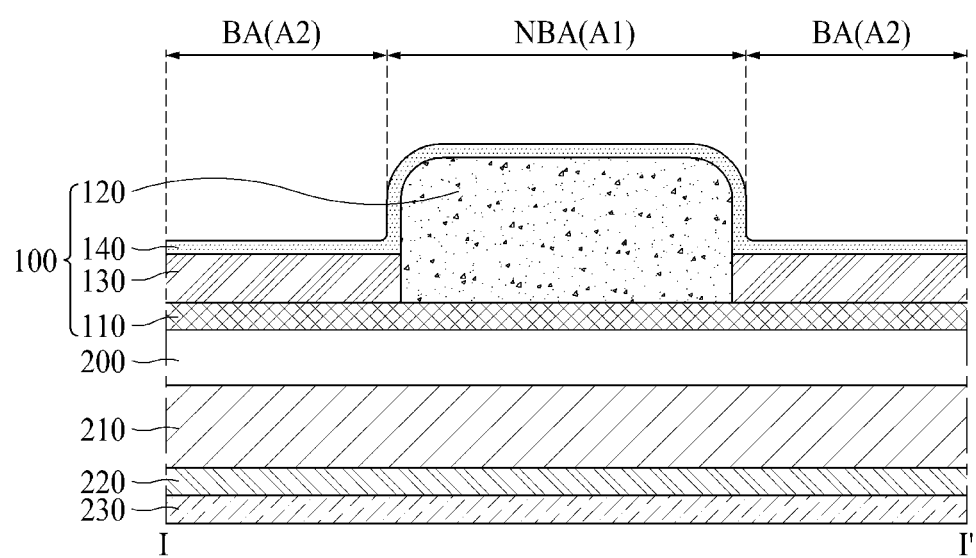
FIG. 5 is a cross-sectional view taken along line I-I' of FIG. 1.
Figure 6:
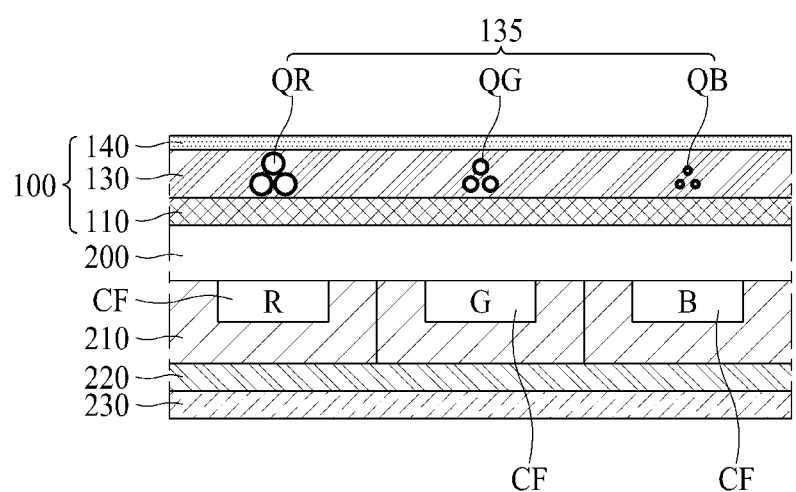
FIG. 6 is a view illustrating a stack structure of an organic light emitting display device provided at a bending area of FIG. 5.

FIG. 5 is a cross-sectional view taken along line I-I' of FIG. 1. FIG. 6 is a view illustrating a stack structure of an organic light emitting display device provided at a bending area of FIG. 5.

Referring to FIGS. 5 and 6, the organic light emitting display device according to this aspect comprises a complex film 100, a substrate 200, a pixel array layer 210, and an encapsulation member 230.

Since the complex film 100 is the same as the aforementioned description, the same description will not be duplicated.

The substrate 200 is a thin film transistor array substrate, and may be made of a glass or plastic material. The substrate 200 according to one example includes a display area DA and a non-display area NA.

The complex film 100 may be provided on the substrate 200. The complex film 100 includes an adhesive layer 110, and this adhesive layer 110 may be attached to the substrate 200. The first area A1 may be overlapped with the non-bending area NBA and the second area A2 may be overlapped with the bending area BA during the process of attaching the complex film 100 to the substrate 200. Therefore, the optical conversion film 130 may be provided on the bending area BA of the substrate 200, and the optical film 120 may be provided on the non-bending area NBA of the substrate 200.

The pixel array layer 210 is arranged on the display area DA of the substrate 200. The pixel array layer 210 according to one example is provided on a first surface of the substrate 200 overlapped with the display area DA defined in the substrate 200. The first surface may be opposite to a second surface of the substrate 200 on which the optical conversion film 130 and the optical film 120 are provided.

The pixel array layer 210 may include scan lines, data lines, driving power lines, a pixel driving circuit, a color filter, and a light emitting diode layer.

The scan lines may be arranged in parallel to a first length direction X of the substrate 200 and spaced apart from each other along a second length direction Y of the substrate 200.

The data lines may be arranged in parallel to the second length direction Y of the substrate 200 and spaced apart from each other along the first length direction X of the substrate 200.

The driving power lines are arranged in parallel to the data lines.

The pixel driving circuit is provided in a pixel area defined by crossing between the scan lines and the data lines, and may include at least two thin film transistors and at least one capacitor. The pixel driving circuit allows the light emitting diode layer to emit light in accordance with a scan signal supplied from its adjacent scan line, a driving power supplied to its driving power line, and a data signal supplied from the data line.

Referring to FIG. 6, the color filter CF is provided in each of a plurality of pixels overlapped with an opening area. Since the light emitting layer according to one example may include a white organic light emitting diode, the color filter CF transmits only light, which has a wavelength of a color corresponding to a corresponding pixel, from the white light. The color filter CF may include a red color filter R, a green color filter G and a blue color filter B, which correspond to colors defined in each of the plurality of pixels.

The light emitting diode layer emits light in accordance with the data signal supplied from the pixel driving circuit to the corresponding pixel. The light emitted from the light emitting diode layer is radiated to the outside by passing through the substrate 200. The light emitting diode layer may include a first electrode connected to the pixel driving circuit of the corresponding pixel, a light emitting layer formed on the first electrode, and a second electrode formed on the light emitting layer.

The first electrode may be an anode electrode patterned individually for the pixels. The first electrode is formed of a transparent metal oxide material such as ITO and IZO, which may transmit light.

The light emitting layer according to one example may be a common layer commonly formed for all pixels. In this case, the manufacturing process may be simplified. The light emitting layer may include any one of an organic light emitting layer, an inorganic light emitting layer, and a quantum-dot light emitting layer, or may include a deposition or mixture structure of the organic light emitting layer (or inorganic light emitting layer) and the quantum-dot light emitting layer. This light emitting layer includes two or more light emitting portions for emitting white light. For example, the light emitting layer may include first and second light emitting portions for generating white light by mixing a first light and a second light. In this case, the first light emitting portion emits the first light, and may include any one of a blue light emitting portion, a green light emitting portion, a red light emitting portion, a yellow light emitting portion, and a cyan light emitting portion. The second light emitting portion may include a light emitting portion for emitting light having a complementary color to the first light among the blue light emitting portion, the green light emitting portion, the red light emitting portion, the yellow light emitting portion, and the cyan light emitting portion.

The second electrode is a cathode electrode, and may be a common layer commonly formed for all pixels. The second electrode may include a metal material having high reflectivity. For example, the second electrode may include a stack structure of Al and Ti (Ti/Al/Ti), a stack structure of Al and ITO (ITO/Al/ITO), an APC alloy (Ag/Pd/Cu), or a stack structure of APC alloy and ITO (ITO/APC/ITO), or may include a single layered structure made of any one material or two or more alloy material selected from Ag, Al, Mo, Au, Mg, Ca and Ba.

The encapsulation member 230 is for preventing water permeation and is provided on the light emitting layer to protect the light emitting layer, which is vulnerable to external water, moisture or oxygen. The encapsulation member 230 is provided on the substrate 200 to cover the second electrode. The encapsulation member 230 may be formed of an inorganic layer or an organic layer, or may be formed of a double layered structure in which the inorganic layer and the organic layer are stacked alternately.

The encapsulation member 230 is attached to the pixel array layer 210 by an adhesive member 220. The adhesive member 220 may be a thermal hardening adhesive or a natural hardening adhesive. For example, the adhesive member 220 may be made of a material such as a pressure-sensitive adhesive material or a barrier pressure-sensitive adhesive material having a moisture absorption function.

Referring to FIG. 6 again, the optical conversion particles 135 are provided on an area overlapped with the color filter CF provided on the pixel array layer 210. The color filter CF may be provided in each of the plurality of pixels overlapped with the opening area, and may include a red color filter R, a green color filter G and a blue color filter B, which correspond to the colors defined in each of the plurality of pixels. In this way, the optical conversion particles 135 may include a red quantum-dot QR, a green quantum-dot QG and a blue quantum-dot QB to correspond to the colors defined in each of the plurality of pixels.

The red quantum-dot QR, the green quantum-dot QG and the blue quantum-dot QB have their respective sizes different from one another, wherein a size of the red quantum-dot QR is greater than that of the green quantum-dot QG, and a size of the green quantum-dot QG is greater than that of the blue quantum-dot QB. The red quantum-dot QR, the green quantum-dot QG and the blue quantum-dot QB according to one example may respectively absorb light having red, green and blue wavelengths by transmitting each of the red color filter R, the green color filter G and the blue color filter B, respectively, and may emit light by making the width of the wavelength narrower, whereby the organic light emitting display device having an excellent color gamut may be realized.

Figure 7A:
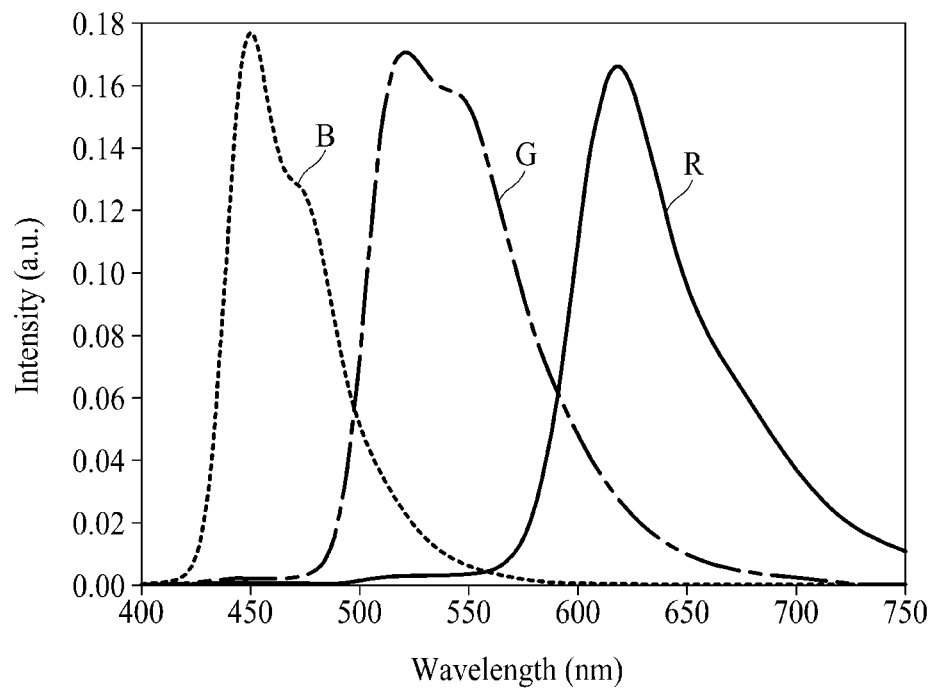
FIG. 7A is a graph illustrating color purity of light emitted from a bending area of an organic light emitting display device of the related art.
Figure 7B:
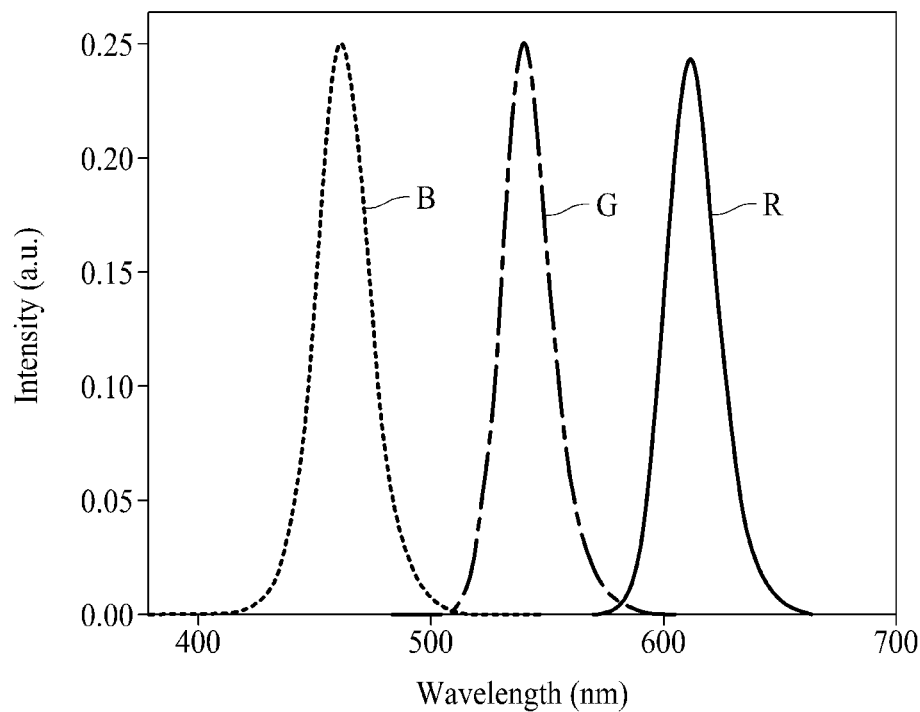
FIG. 7B is a graph illustrating color purity of light emitted from an organic light emitting display device according to one aspect of the present disclosure.

FIG. 7A is a graph illustrating color purity of light emitted from a bending area of an organic light emitting display device of the conventional art. FIG. 7B is a graph illustrating color purity of light emitted from an organic light emitting display device according to an aspect of the present disclosure.

Referring to FIGS. 7a and 7b in comparison, it is noted that the organic light emitting display device according to an aspect of the present disclosure has a narrower wavelength range for outputting light and the color purity is higher as compared with the organic light emitting display device of the related art. That is, in the organic light emitting display device according to the present disclosure, the color purity is higher than that of the organic light emitting display device of the related art, and the emitted light may have uniformed luminance over the whole surface of the substrate.

In the organic light emitting display device according to the present disclosure, since the optical conversion film 130 having the optical conversion particles 135 may be arranged on the bending area BA by using the complex film 100, the excellent color gamut may be achieved by increase of the color purity, and high efficiency may be achieved according to narrow FWHM (Full Width at Half Maximum) characteristics, whereby optical characteristics may be improved.

Also, in the organic light emitting display device according to the present disclosure, since the optical conversion particles 135 may be formed of the quantum-dot having various sizes, a fine color variations of the organic light emitting display device may be acquired by controlling the quantum-dot. That is, the quantum-dot may be formed as a quantum-dot that absorbs/emits complementary colors to red, green and blue colors or absorbs/emits a color for controlling/adjusting colors in detail, whereby the fine color variation may be acquired.

The width of the wavelength and color purity value are not limited to the example of FIG. 7A, and the size of the optical conversion particles 135 may be adjusted to have a narrower wavelength width and a higher color purity value.

Figure 8A:
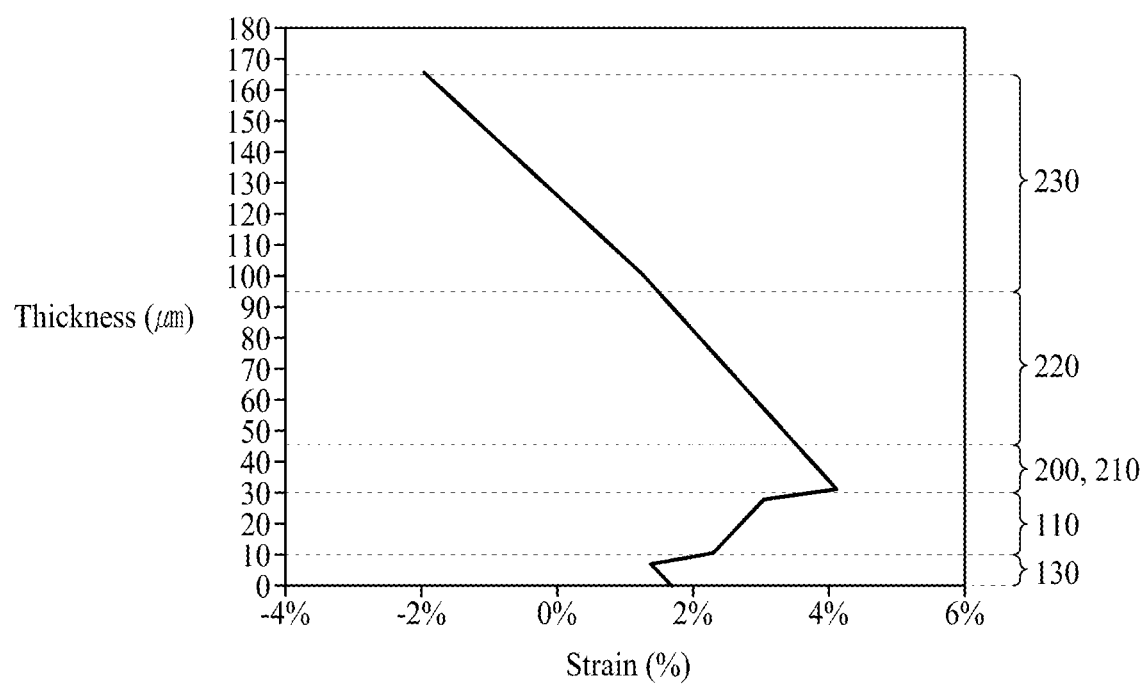
FIG. 8A is a graph illustrating a stress distribution at a bending area of an organic light emitting display device according to one aspect of the present disclosure.
Figure 8B:
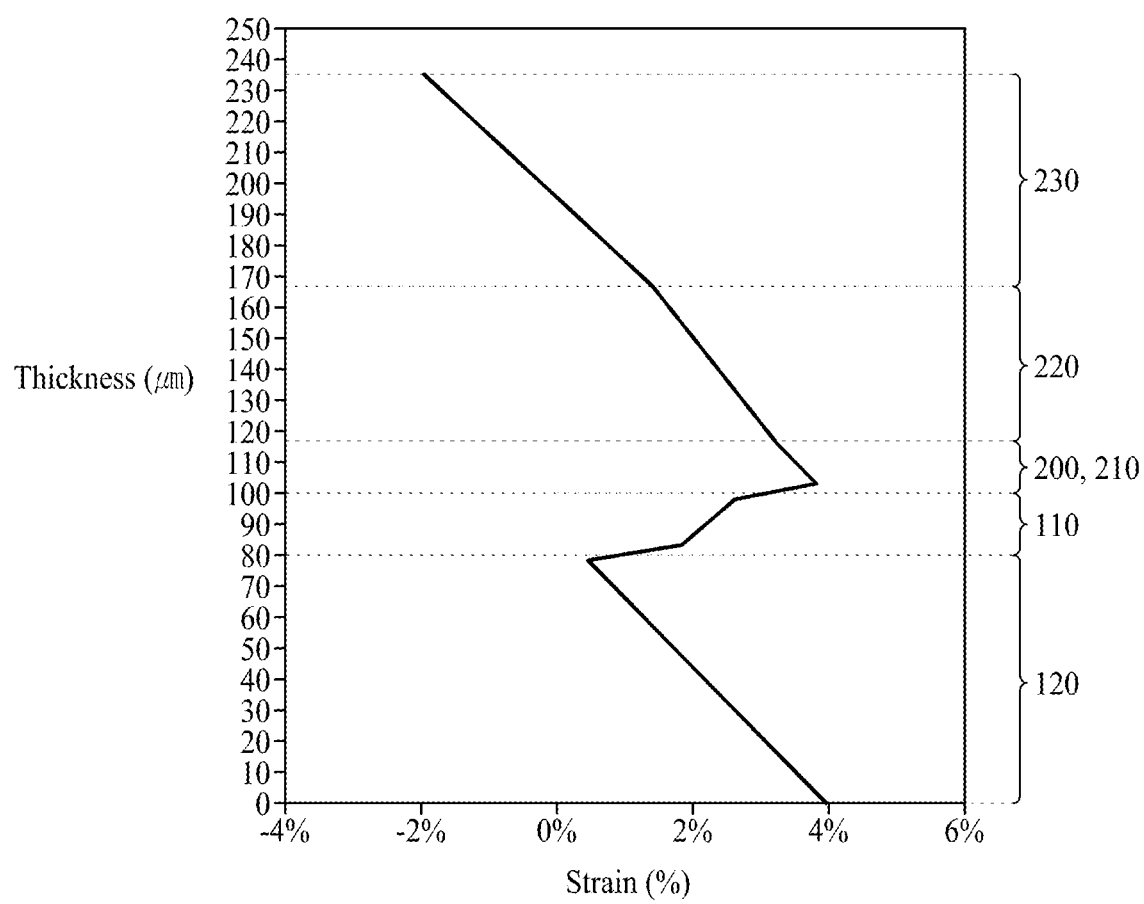
FIG. 8B is a graph illustrating a stress distribution at a bending area of an organic light emitting display device of the related art.

FIG. 8A is a graph illustrating a stress distribution at a bending area of an organic light emitting display device according to an aspect of the present disclosure. FIG. 8B is a graph illustrating a stress distribution at a bending area of an organic light emitting display device of the conventional art.

Referring to FIGS. 8A and 8B in comparison, in the organic light emitting display device according to the present disclosure, it is noted that the bending area BA is narrower than that of the organic light emitting display device of the related art. If the optical film 120 is arranged on the bending area BA, outermost stress of the panel according to bending process is increased, and the bending stress in the panel also becomes strong. Therefore, problems occur in that the light emitting diode layer is peeled off or torn out and the thin film transistor is broken or damaged. By contrast, when the optical conversion film 130 is arranged on the bending area BA, outermost stress of the panel according to bending process is not too great, whereby the light emitting diode layer may be prevented from being peeled off or the thin film transistor may be prevented from being damaged.

Since the optical conversion film 130 according to one example has a thickness of 10 um and the optical film 120 has a thickness of 80 um, the organic light emitting display device may have a relatively thinner thickness on the bending area BA and facilitate the excellent bending condition. In more detail, since the stress subjected to the optical conversion film 130 is less than 2%, it is noted that the stress is reduced to a half or less as compared with the stress subjected to the optical film 120. Therefore, it is noted that the outermost stress applied to the panel is reduced.

The thickness and the stress distribution of the organic light emitting display device are not limited to the example of FIGS. 8A and 8B, and the thickness of the optical conversion film 130 may be adjusted to have a lower stress value.

As described above, in the organic light emitting display device according to the present disclosure, the complex film 100 has a different structure as compared with the related art in which the optical film 120 is disposed at the non-bending area NBA and the bending area BA, whereby a problem that a crack is generated during the bending process may be solved, and a better color gamut may be obtained. The optical conversion particles 135 included in the optical conversion film 130 may absorb the external light as well as the light radiated to the outside in the organic light emitting display device. Therefore, the optical conversion film 130 may serve as a light anti-reflection member, and may absorb the external lights to convert the external light into the light having a specific wavelength, whereby the color gamut of the organic light emitting display device may be improved.

As described above, according to the present disclosure, the following effects and advantages may be obtained.

The organic light emitting display device according to the present disclosure facilitates bending on the bending area and has optical characteristics of wide color gamut, whereby a stereoscopic effect and an immersion level may be improved.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the present disclosure can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A complex film comprising:
    an adhesive layer having a first area and a second area;
    an optical film provided on the first area of the adhesive layer, wherein the optical film includes a wave plate provided on the first area of the adhesive layer, a linear polarizing layer provided on the wave plate and a low-reflection layer provided on the linear polarizing layer;
    an optical conversion film provided on the second area of the adhesive layer; and
    a protective film covering the optical film and the optical conversion film.

2. The complex film according to claim 1, wherein the optical conversion film includes a plurality of optical conversion particles.

3. The complex film according to claim 2, wherein the plurality of optical conversion particles includes quantum-dots.

4. The complex film according to claim 1, wherein a sidewall of the optical film and a sidewall of the optical conversion film are in contact with each other, and a boundary between the sidewalls forms a step difference.

5. The complex film according to claim 4, wherein the optical film is thicker than the optical conversion film.

6. The complex film according to claim 4, wherein the protective film covers the boundary of the optical film and the optical conversion film.

7. An organic light emitting display device comprising:
    a substrate including a bending area and a non-bending area;
    an optical conversion film provided on the bending area of the substrate;
    an optical film provided on the non-bending area of the substrate, wherein the optical film includes a wave plate provided on the non-bending area of the substrate, a linear polarizing layer provided on the wave plate and a low-reflection layer provided on the linear polarizing layer; and
    a protective film attached to the optical film and the optical conversion film.

8. The organic light emitting display device according to claim 7, wherein the optical conversion film includes a plurality of optical conversion particles.

9. The organic light emitting display device according to claim 8, wherein the optical conversion particles includes quantum-dots.

10. The organic light emitting display device according to claim 7, further comprising:
    a pixel array layer provided on a first surface of the substrate; and
    an encapsulation member covering the pixel array layer, wherein the optical conversion film and the optical film are provided on the second surface opposite to the first surface of the substrate.

11. The organic light emitting display device according to claim 8, further comprising a plurality of pixels provided on the bending area, wherein the plurality of optical conversion particles has respective sizes different from one another in accordance with a color set in each of the plurality of pixels.

12. The organic light emitting display device according to claim 11, wherein the plurality of optical conversion particles includes a red quantum-dot, a green quantum-dot, and a blue quantum-dot.

13. A bendable organic light emitting display device having a substrate including a bending area and a non-bending area, comprising:
    an optical conversion film disposed at the bending area and including a plurality of optical conversion particles converting incident light to improve color gamut; and
    an optical film disposed at the non-bending area and preventing reflection of external light;
    an adhesive layer attaching the optical conversion film and the optical film with the substrate; and
    a protective film covering the optical film and the optical conversion film.

14. The organic light emitting display device according to claim 13, wherein the plurality of optical conversion particles includes quantum-dots.

15. The organic light emitting display device according to claim 13, wherein the optical film and the optical conversion film are in direct contact with each other at lateral sides.

16. The organic light emitting display device according to claim 13, wherein the optical film is thicker than the optical conversion film.

17. The complex film according to claim 13, wherein the protective film covers a boundary of the optical film and the optical conversion film.

18. The complex film according to claim 13, wherein the optical film includes:
    a wave plate disposed on the first area of the adhesive layer;
    a linear polarizing layer disposed on the wave plate; and
    a low-reflection layer disposed on the linear polarizing layer.

* * * * *